United States Patent
Basker et al.

(10) Patent No.: US 8,815,661 B1
(45) Date of Patent: Aug. 26, 2014

(54) MIM CAPACITOR IN FINFET STRUCTURE

(71) Applicant: International Business Machines Corporation, Armonk, NY (US)

(72) Inventors: Veeraraghavan S. Basker, Schenectady, NY (US); Effendi Leobandung, Wappingers Falls, NY (US); Tenko Yamashita, Schenectady, NY (US); Chun-Chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/768,248

(22) Filed: Feb. 15, 2013

(51) Int. Cl.
*H01L 29/94* (2006.01)
*H01L 21/336* (2006.01)

(52) U.S. Cl.
USPC .......................................... 438/164; 438/253

(58) Field of Classification Search
CPC ............ H01L 29/66795; H01L 29/785; H01L 21/823821; H01L 27/0629; H01L 27/0886
USPC .............. 438/164, 253; 257/E21.415, E21.43
See application file for complete search history.

(56) References Cited

U.S. PATENT DOCUMENTS

| | | | |
|---|---|---|---|
| 6,881,642 B2 | 4/2005 | Basceri et al. | |
| 6,947,275 B1 | 9/2005 | Anderson et al. | |
| 6,995,412 B2 | 2/2006 | Fried et al. | |
| 7,091,551 B1 | 8/2006 | Anderson et al. | |
| 7,291,877 B2 | 11/2007 | Brederlow et al. | |
| 7,635,893 B2 | 12/2009 | Weis et al. | |
| 7,683,417 B2 | 3/2010 | Xiong et al. | |
| 7,692,254 B2 * | 4/2010 | Anderson et al. | 257/401 |
| 7,696,040 B2 | 4/2010 | Zhu | |
| 7,714,397 B2 | 5/2010 | Hareland et al. | |
| 7,776,684 B2 | 8/2010 | Doyle et al. | |
| 7,851,865 B2 * | 12/2010 | Anderson et al. | 257/365 |
| 8,399,938 B2 * | 3/2013 | Cheng et al. | 257/401 |
| 8,410,544 B2 * | 4/2013 | Chan et al. | 257/328 |
| 8,420,476 B2 * | 4/2013 | Booth et al. | 438/210 |
| 8,610,249 B2 * | 12/2013 | Di Sarro et al. | 257/532 |
| 2007/0018239 A1 | 1/2007 | Chen et al. | |
| 2007/0257319 A1 * | 11/2007 | Xiong et al. | 257/368 |

(Continued)

OTHER PUBLICATIONS

K. Itoh et al., "FD-SOI MOSFETs for the low-voltage nanoscale CMOS era," 2009 IEEE International SOI Conference, Oct. 5-8, 2009, 4 pages.

(Continued)

*Primary Examiner* — George Fourson, III
(74) *Attorney, Agent, or Firm* — Law Offices of Ira D. Blecker, P.C.

(57) ABSTRACT

A method of forming a FinFET structure having a metal-insulator-metal capacitor. Silicon fins are formed on a semiconductor substrate followed by formation of the metal-insulator-metal capacitor on the silicon fins by depositing sequential layers of a first layer of titanium nitride, a dielectric layer and a second layer of titanium nitride. A polysilicon layer is deposited over the metal-insulator-metal capacitor followed by etching back the polysilicon layer and the metal-insulator-metal capacitor layers from ends of the silicon fins so that the first and second ends of the silicon fins protrude from the polysilicon layer. A spacer may be formed on surfaces facing the ends of the silicon fins followed by the formation of epitaxial silicon over the ends of the silicon fins. Also disclosed is a FinFET structure having a metal-insulator-metal capacitor.

12 Claims, 8 Drawing Sheets

(56) References Cited

U.S. PATENT DOCUMENTS

| | | |
|---|---|---|
| 2008/0237678 A1 | 10/2008 | Datta et al. |
| 2011/0101455 A1* | 5/2011 | Basker et al. ................. 257/347 |
| 2011/0291166 A1 | 12/2011 | Booth, Jr. et al. |
| 2011/0298025 A1* | 12/2011 | Haensch et al. ............. 257/296 |
| 2012/0132989 A1* | 5/2012 | Haensch et al. ............. 257/347 |
| 2012/0298965 A1* | 11/2012 | Haensch et al. ............... 257/29 |
| 2013/0001705 A1* | 1/2013 | Su et al. ......................... 257/401 |
| 2013/0052801 A1* | 2/2013 | Berliner et al. .............. 438/468 |
| 2013/0105894 A1* | 5/2013 | Brodsky et al. .............. 257/347 |
| 2013/0154005 A1* | 6/2013 | Basker et al. ................. 257/347 |
| 2013/0154006 A1* | 6/2013 | Basker et al. ................. 257/347 |
| 2014/0080275 A1* | 3/2014 | Harley et al. ................. 438/283 |

OTHER PUBLICATIONS

Prosecution History of related U.S. Appl. No. 14/015,559, Notice of Allowance mailed Apr. 11, 2014, all pages.

Prosecution History of corresponding foreign (PCT) patent application (PCT/US2014/015379), International Search Report and Written Opinion, May 9, 2014, all pages.

\* cited by examiner

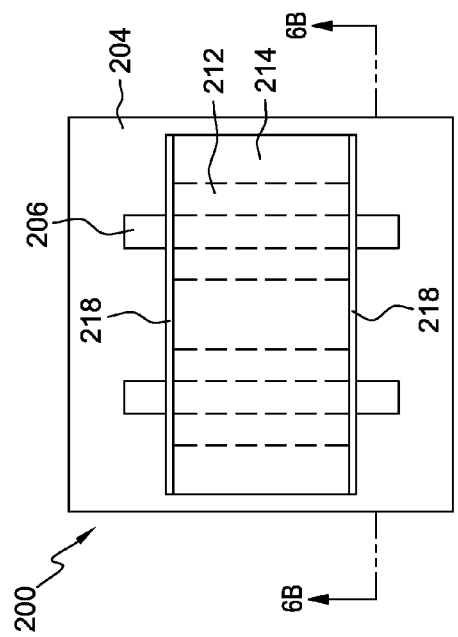
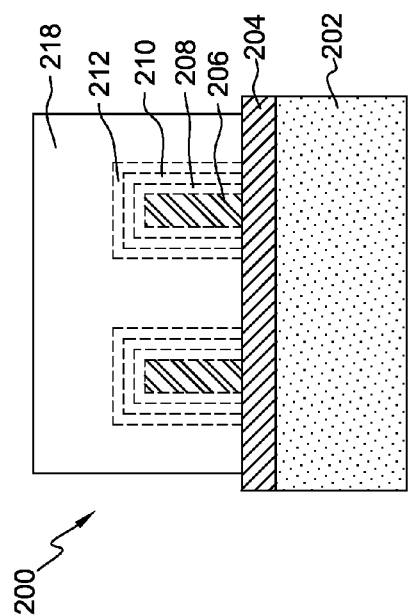
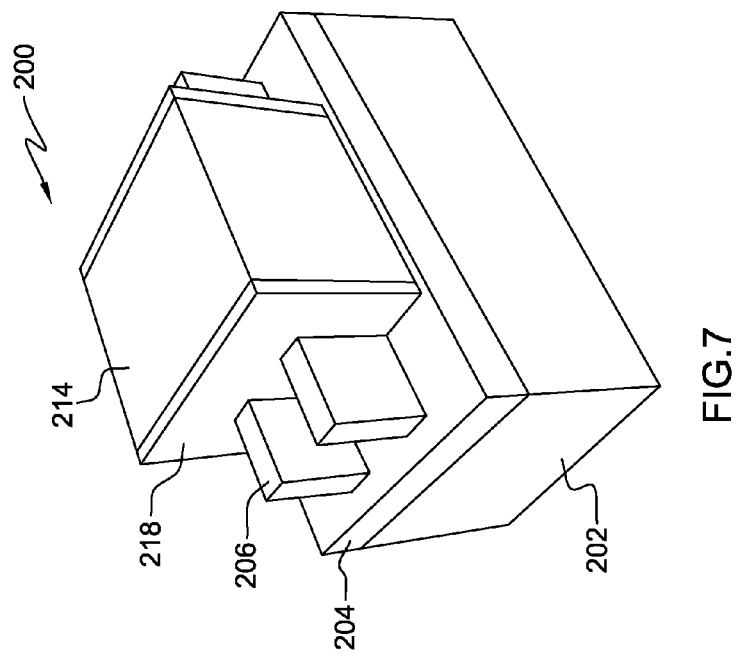

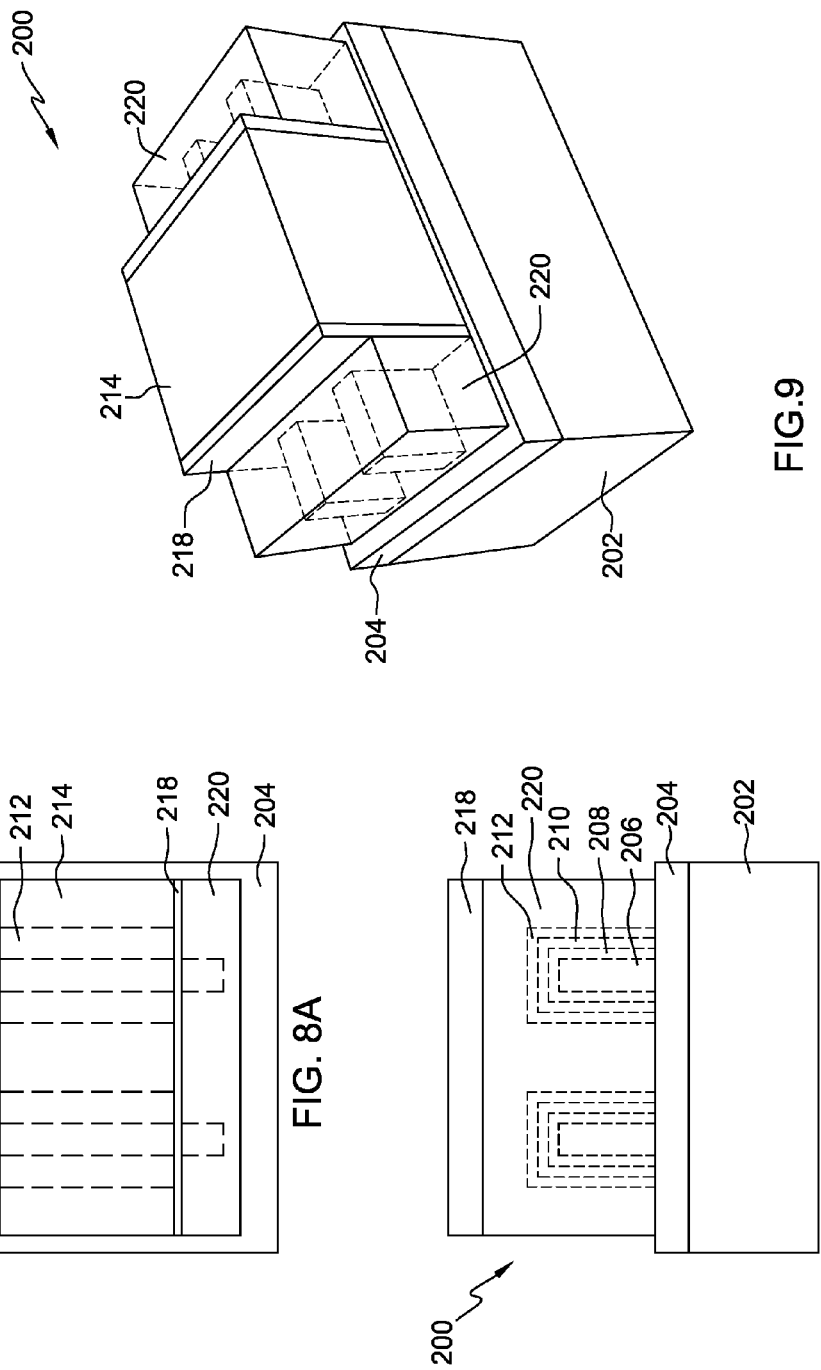

MIM CAPACITOR IN FINFET STRUCTURE

BACKGROUND

The present invention relates to FinFET structures and, more particularly, relates to a metal-insulator-metal capacitor fabrication process in a FinFET structure.

Semiconductor circuits typically include both active semiconductor devices, such as but not limited to transistors and diodes, as well as passive devices, such as but not limited to resistors and capacitors. As semiconductor technology has advanced over several decades, both the active semiconductor devices and the passive devices have conventionally been scaled to increasingly smaller dimensions to reduce costs.

Capacitors are one of the fundamental components in today's electronic devices and operate by storing a charge. For example, capacitors are often used in dynamic random access memory (DRAM) and other similar devices.

FinFET devices and FinFET structures are nonplanar devices and structures typically built on a semiconductor on insulator (SOI) substrate. The FinFET devices may comprise a vertical semiconductor fin, rather than a planar semiconductor surface, having a single or double gate wrapped around the fin. In an effort to provide for continued scaling of semiconductor structures to continuously smaller dimensions while maintaining or enhancing semiconductor device performance, the design and fabrication of semiconductor fin devices and semiconductor fin structures has evolved within the semiconductor fabrication art.

BRIEF SUMMARY

The various advantages and purposes of the exemplary embodiments as described above and hereafter are achieved by providing, according to a first aspect of the exemplary embodiments, a method of forming a FinFET structure which includes forming silicon fins on a semiconductor substrate, each silicon fin having two sides and a horizontal surface; depositing sequential layers of a first layer of titanium nitride, a dielectric layer and a second layer of titanium nitride on the sides and horizontal surface of the silicon fins; depositing a polysilicon layer over the second layer of titanium nitride on the silicon fins and over the semiconductor substrate; selectively etching the polysilicon layer and the sequential layers of first layer of titanium nitride, dielectric layer and second layer of titanium nitride from a first end and a second end of the silicon fins so that the first and second ends of the silicon fins protrude from the polysilicon layer, the polysilicon layer having a surface that faces each of the first and second ends of the silicon fins; forming a spacer over each of the two surfaces and a portion of the first and second ends of the silicon fins such that the first and second ends of the silicon fins protrude from the spacers; forming epitaxial silicon over the first and second ends of the silicon fins to form sources and drains, wherein the combination of the first layer of titanium nitride, dielectric layer and second layer of titanium nitride forms a metal-insulator-metal capacitor situated between each silicon fin and the polysilicon layer.

According to a second aspect of the exemplary embodiments there is provided a method of forming a FinFET structure having a metal-insulator-metal capacitor which includes forming silicon fins on a semiconductor substrate, each silicon fin having two sides and a horizontal surface; forming a metal-insulator-metal capacitor on the sides and horizontal surface of the silicon fins by depositing sequential layers of a first layer of titanium nitride, a dielectric layer and a second layer of titanium nitride; depositing a polysilicon layer over the metal-insulator-metal capacitor and over the semiconductor substrate; selectively etching the polysilicon layer and the metal-insulator-metal capacitor from a first end and a second end of the silicon fins so that the first and second ends of the silicon fins protrude from the polysilicon layer, the polysilicon layer having a surface that faces each of the first and second ends of the silicon fins; forming a spacer over each of the two surfaces and a portion of the first and second ends of the silicon fins such that the first and second ends of the silicon fins protrude from the spacers; and forming epitaxial silicon over the first and second ends of the silicon fins to form sources and drains.

According to a third aspect of the exemplary embodiments, there is provided a FinFET structure which includes silicon fins on a semiconductor substrate, each silicon fin having two sides and a horizontal surface; sequential layers of a first layer of titanium nitride, a dielectric layer and a second layer of titanium nitride on the sides and horizontal surface of the silicon fins; a polysilicon gate layer over the second layer of titanium nitride on the silicon fins and over the semiconductor substrate such that first and second ends of the silicon fins protrude from the polysilicon layer, the polysilicon layer having a surface that faces each of the first and second ends of the silicon fins; a spacer over each of the two surfaces and a portion of the first and second ends of the silicon fins such that the first and second ends of the silicon fins protrude from the spacers; epitaxial silicon over the first and second ends of the silicon fins to form sources and drains, wherein the combination of the first layer of titanium nitride, dielectric layer and second layer of titanium nitride forms a metal-insulator-metal capacitor situated between each silicon fin and the polysilicon layer.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 1A to 1H illustrate a process for forming fins on a semiconductor substrate wherein:

FIG. 1A illustrates a starting structure including a semiconductor on insulator (SOI) substrate, an oxide layer, an amorphous silicon layer and a hard mask layer;

FIG. 1B illustrates the patterning of the amorphous silicon layer and the hard mask layer;

FIG. 1C illustrates the removal of the hard mask layer, leaving only stripes of amorphous silicon;

FIG. 1D illustrates the deposition of a conformal layer of nitride;

FIG. 1E illustrates the etching of the nitride to form sidewall spacers;

FIG. 1F illustrates the etching of the stripes of amorphous silicon to leave only the sidewall spacers;

FIG. 1G illustrates the etching of the oxide layer and the silicon layer of the SOI substrate using the sidewall spacers as a mask to result in stripes of oxide on silicon fins; and FIG. 1H illustrates the etching of the sidewall spacers and the oxide stripes to result in silicon fins.

FIGS. 6A and 6B illustrate the forming of a spacer on the polysilicon layer and portions of the ends of the fins.

FIG. 7 is a perspective view of the structure shown in FIGS. 6A and 6B.

FIGS. 8A and 8B illustrate the formation of epitaxial silicon on the ends of the fins to form a merged source and merged drain.

FIG. 9 is a perspective view of the structure shown in FIGS. 8A and 8B.

DETAILED DESCRIPTION

Referring to the Figures in more detail, and particularly referring to FIGS. 1A to 1H, there is illustrated a preferred process for forming a semiconductor substrate having fins for practicing the exemplary embodiments. The preferred process may be referred to as the sidewall image transfer process.

Figure 1B:
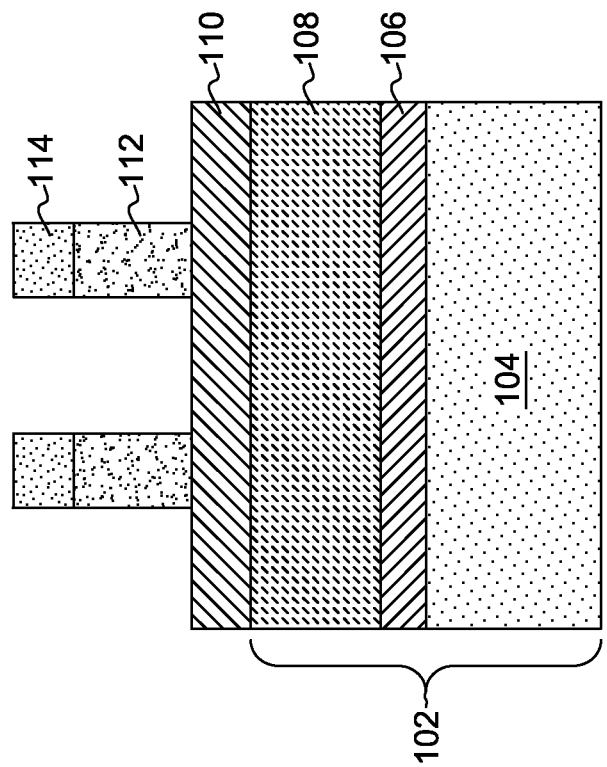
Figure 1A:
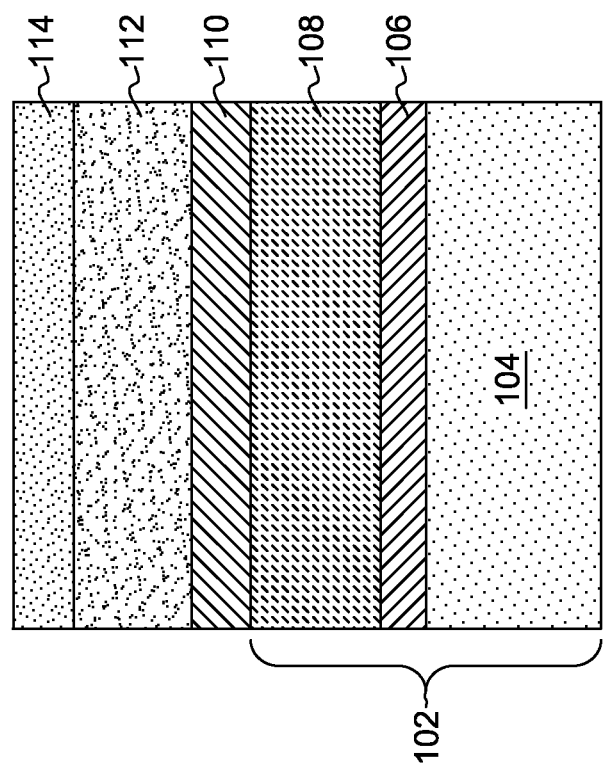

In FIG. 1A, the process begins with a semiconductor on insulator (SOI) substrate 102, also frequently referred to as a silicon on insulator substrate. The SOI substrate 102 may comprise a semiconductor base 104 (usually silicon but may be other semiconductor materials), a dielectric layer 106, usually an oxide layer (may also be called a buried oxide or BOX layer), and a semiconductor material 108, which is usually silicon. For the purposes of the present exemplary embodiments, it is preferred that semiconductor material 108 is silicon and will be referred to as such in the discussion that follows. On top of silicon 108 is an oxide layer 110, followed by an amorphous silicon layer 112 and hard mask layer 114, usually a nitride. Not shown in FIG. 1A are photoresist and other layers which may be used to pattern the hard mask layer 114.

Referring now to FIG. 1B, the hard mask layer 114 has been patterned and etched down through the amorphous silicon layer 112, stopping on the oxide layer 110.

Figure 1D:
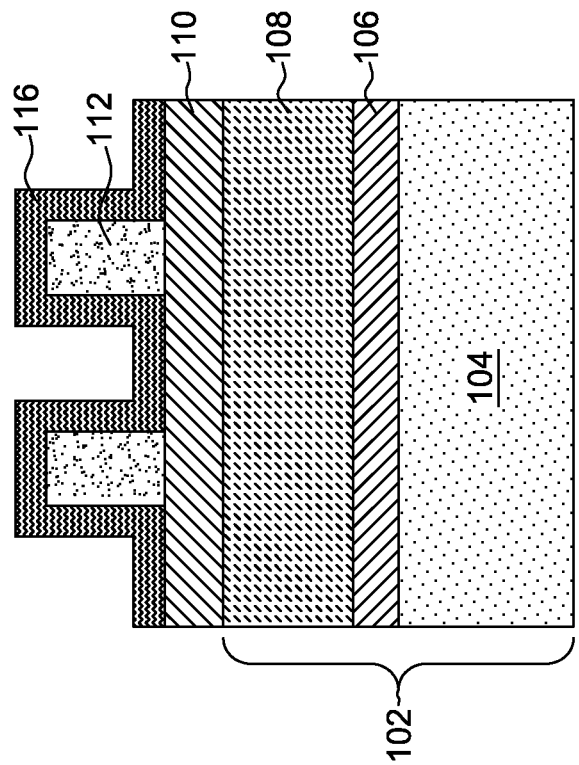
Figure 1C:
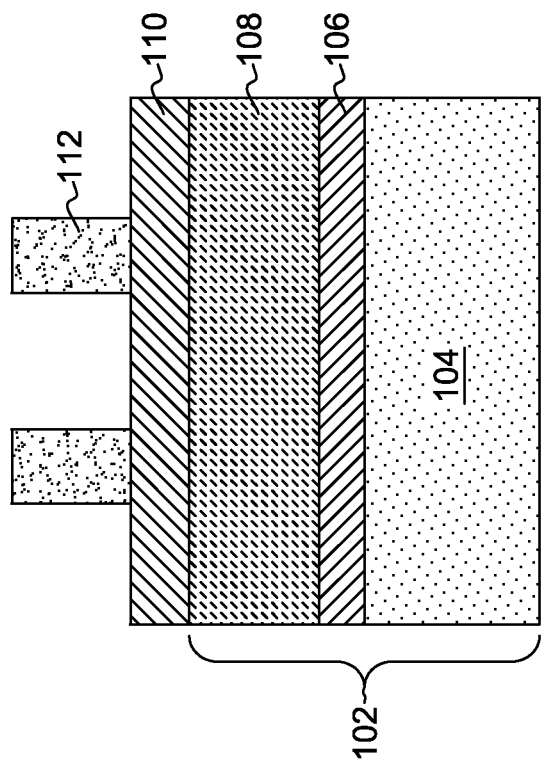

Referring now to FIG. 1C, the hard mask layer 114 has been conventionally stripped, leaving only stripes of amorphous silicon 112. Shown in FIG. 1C are only the ends of the stripes of amorphous silicon 112 which run perpendicular to the page.

Thereafter, a conformal layer of nitride 116 is deposited over the stripes of amorphous silicon 112, as shown in FIG. 1D.

Figure 1E:
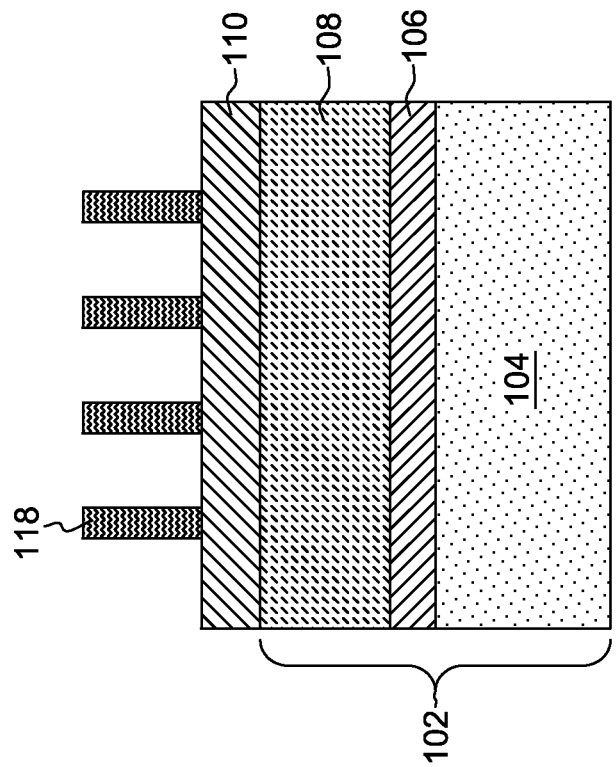
Figure 1F:
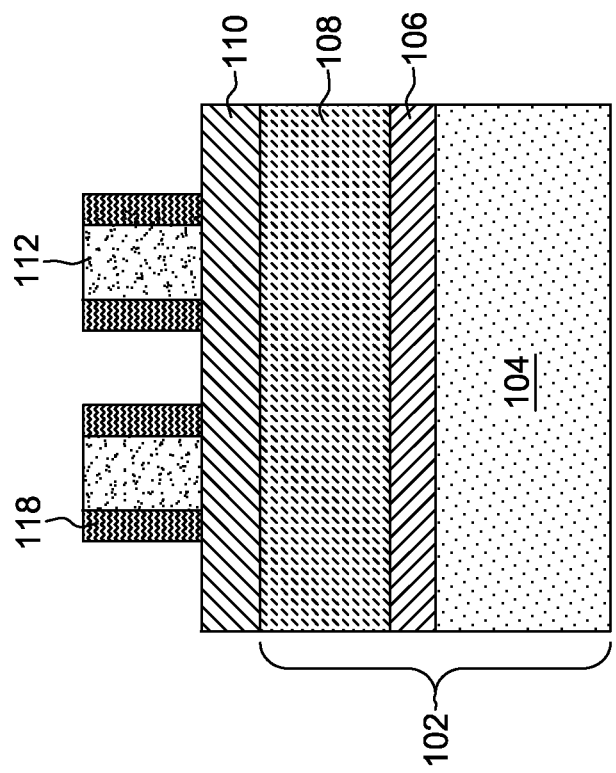

The conformal layer of nitride 116 is conventionally etched to form sidewall spacers 118, as shown in FIG. 1E, followed by conventionally etching the stripes of amorphous silicon 112 to result in only the spacers 118 left on the surface of oxide layer 110, as shown in FIG. 1F.

Figure 1H:
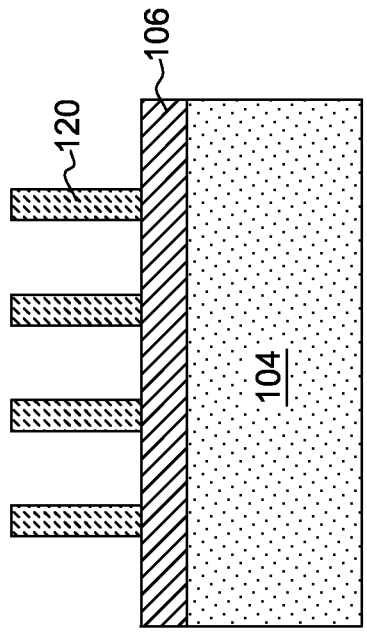
Figure 1G:
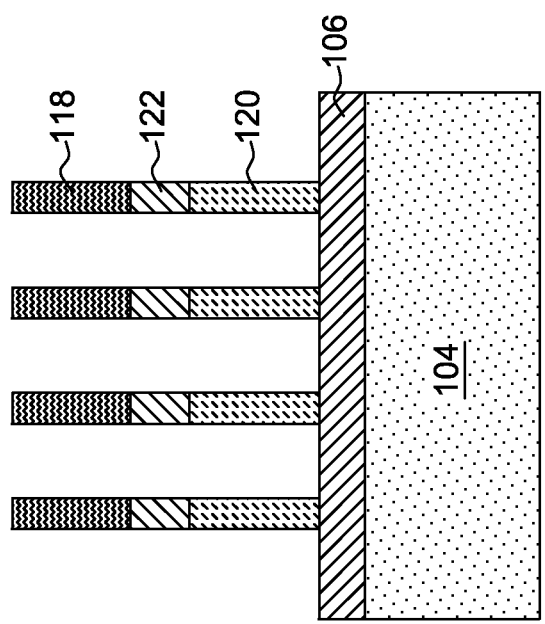

Using the spacers 118 as a mask, the substrate is etched to form fins 120 and stripes of oxide 122 on the fins 120 as shown in FIG. 1G.

Referring now to FIG. 1H, the spacers 118 and stripes of oxide 122 are conventionally etched to result in fins 120 on BOX layer 106.

In the description of FIGS. 2A to 6A and 2B to 6B that follows, the "A" Figure is a plan view of the FinFET structure as it is being processed and the "B" Figure is a cross-section view of the "A" Figure in the direction of the arrows B-B. FIG. 8A is a plan view of the FinFET structure as it is being processed and FIG. 8B is a side view of FIG. 8A.

Figure 2A:
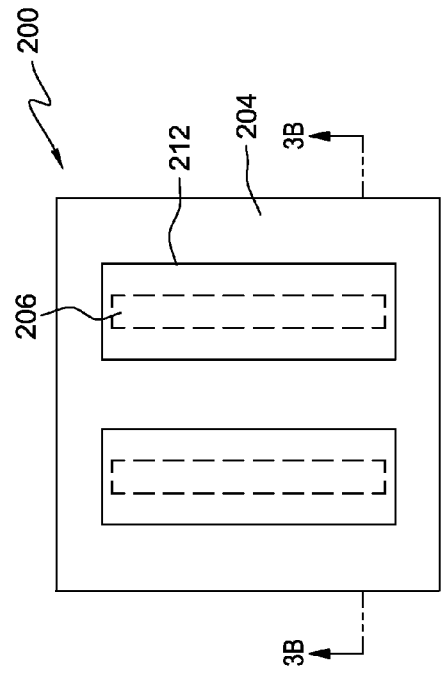
FIGS. 2A and 2B illustrate a starting structure of the exemplary embodiments which include fins on a semiconductor substrate.
Figure 2B:
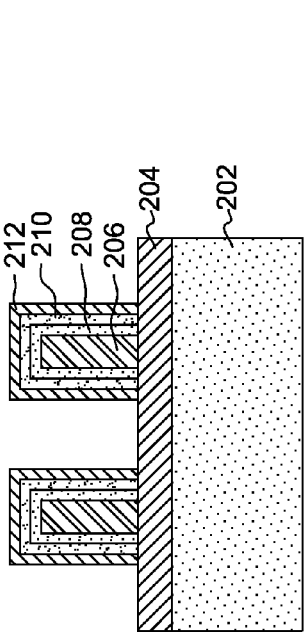

Referring now to FIGS. 2A and 2B, there is shown a FinFET structure 200 that starts with the structure shown in FIG. 1H comprising a semiconductor material 202, a BOX layer 204 and silicon fins 206. The silicon material is preferably uniformly doped along the length of the silicon fins 206, most preferably highly doped to a dopant level of about $5\times10^{20}$ to $1\times10^{21}$ atoms/cm$^3$. The silicon material may be doped by ion implantation or in-situ doped amorphous silicon deposition. The dopants may be, for example, arsenic or boron.

A metal-insulator-metal (MIM) capacitor now may be fabricated upon the silicon fins 206.

Figure 3A:
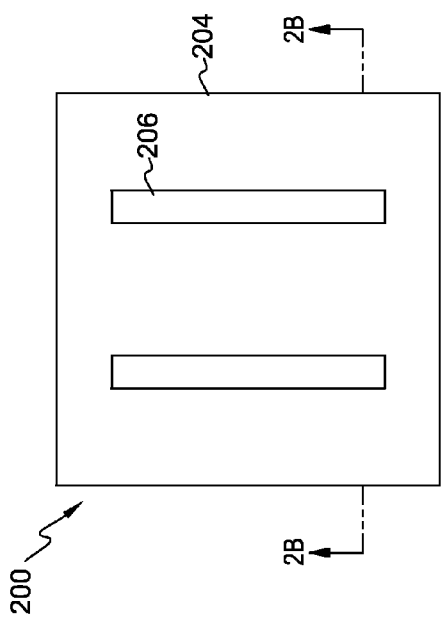
FIGS. 3A and 3B illustrate forming sequential layers of a first titanium nitride, a dielectric and a second titanium nitride on the fins.
Figure 3B:
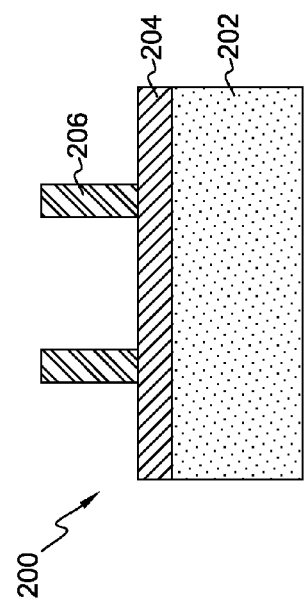

Referring now to FIGS. 3A and 3B, sequential layers are deposited over the silicon fins 206 that will form the basis of the MIM capacitor. A first layer of titanium nitride 208 is deposited over the silicon fins 206, followed by a dielectric layer 210 and a second layer of titanium nitride 212. The layers of first layer of titanium nitride 208, dielectric layer 210 and second layer of titanium nitride 212 may be deposited by atomic layer deposition (ALD) to achieve conformal film deposition from the top of the silicon fins 206 to the bottom of the silicon fins 206. The first titanium nitride layer 208 may have a thickness of about 5 to 10 nanometers (nm), the dielectric layer 210 may have a thickness of about 2 to 5 nm and the second titanium nitride layer 212 may have a thickness of about 5 nm. For the sake of clarity, the first titanium nitride layer 208 and dielectric layer 210 are not shown in FIG. 3A and subsequent plan views. The dielectric layer 210 is preferably a high-k (high dielectric constant) material in order to enhance the dielectric constant and lower the gate tunneling current. Some examples of suitable high-k dielectric materials may be hafnium oxide ($HfO_2$), aluminum oxide ($Al_2O_3$) and lanthanum oxide ($La_2O_3$).

Figure 4A:
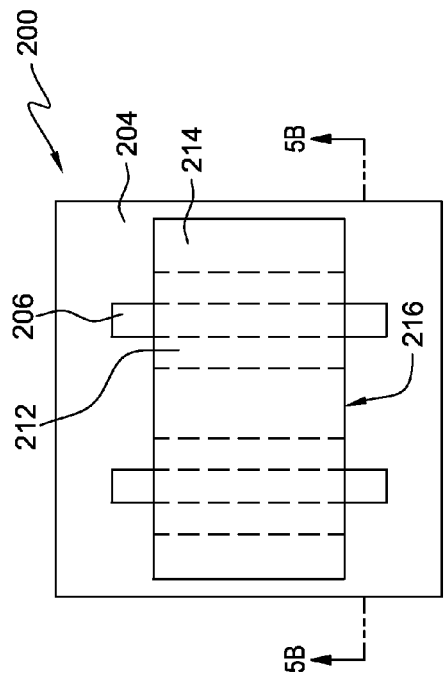
FIGS. 4A and 4B illustrate a next step of depositing a polysilicon layer.
Figure 4B:
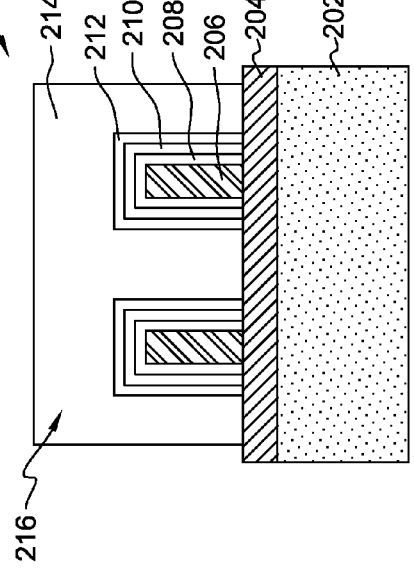

As shown in FIGS. 4A and 4B, a polysilicon gate layer 214 has been deposited over and around the silicon fins 206 having the first layer of titanium nitride 208, dielectric layer 210 and second layer of titanium nitride 212. The polysilicon gate layer 214 is preferably doped, most preferably highly doped to a dopant level of about $5\times10^{20}$ to $1\times10^{21}$ atoms/cm$^3$. The polysilicon layer may be deposited by a process such as low pressure chemical vapor deposition (LPCVD). After deposition, it may be doped by ion implantation with dopants such as arsenic or boron.

Highly doped silicon for the silicon fins 206 and highly doped polysilicon for the polysilicon gate layer 214 are preferred to achieve adequate frequency response and to minimize capacitor resistance.

Figure 5A:
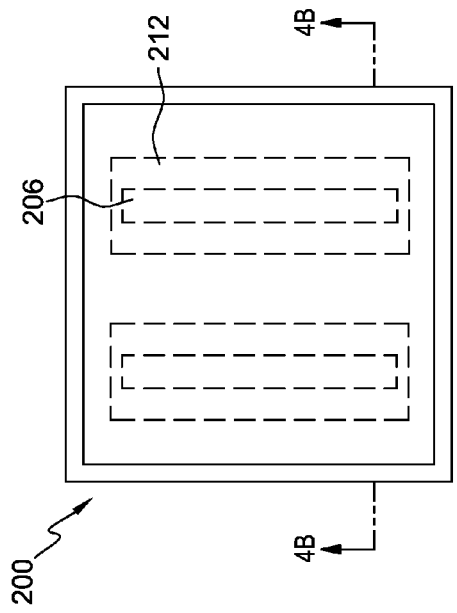
FIGS. 5A and 5B illustrate etching back the polysilicon layer and sequential layers of a first titanium nitride, a dielectric and a second titanium nitride from ends of the fins.
Figure 5B:
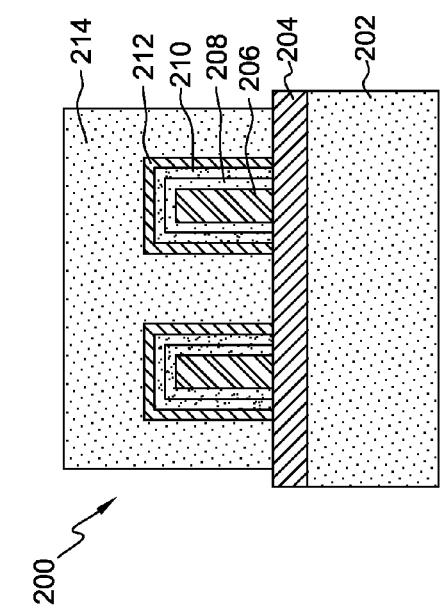

In a next step, as shown in FIGS. 5A and 5B, polysilicon gate layer 214 is etched back to expose the layered fins 206, 208, 210, 212. The polysilicon gate layer 214 may be etched by high density plasma with chlorine-based chemistry. Precursors in the plasma may include $Cl_2$, $CF_4$, $CHF_3$, HBr and $SiF_6$. The etching of the polysilicon gate layer 214 is followed by etching of the exposed second layer of titanium nitride 212, dielectric layer 210 and first layer of titanium nitride 208 off of the silicon fins 206. The etching of the exposed second layer of titanium nitride 212, dielectric layer 210 and first layer of titanium nitride 208 off of the silicon fins 206 may be also by high density plasma with chlorine-based chemistry but with different precursors. Precursors in the plasma may include $Cl_2$ and $BCl_3$. Protruding from the polysilicon gate layer 214 are the silicon fins 206 without any of the layers previously deposited.

In a next process, a spacer is formed on each surface 216 (shown best in FIG. 5B) facing the silicon fins 206. The spacer may be formed by depositing silicon nitride or silicon oxide over the silicon fins 206 and against surface 216 of the polysilicon gate layer 214 and then etching away the excess spacer material to leave spacer 218 against each surface 216 of the polysilicon gate layer 214. The spacer may be formed by, for example, plasma enhanced chemical vapor deposition (PECVD) followed by a subsequent thermal process at 700° C. or more. The resulting FinFET structure 200 is shown in FIGS. 6A and 6B. FIG. 7 is a perspective view of the FinFET structure 200 thus far.

In a next process as shown in FIGS. 8A, 8B and 9, epitaxial silicon is grown on the silicon fins 206 to form a merged source and drain 220. The epitaxial process to grow the epitaxial silicon may start with a hydrofluoric acid (HF) pre-clean, followed by a hydrogen ($H_2$) anneal to purge out oxygen. The epitaxial silicon is achieved through a silane-based precursor to deposit epitaxial silicon on the silicon fins 206 and then form crystalline bonding. The flat surface shown for merged source and drain 220 may be achieved by an additional silicon etch back process.

Further semiconductor processing may now take place to finish the FinFET structures 200.

The combination of the first layer of titanium nitride, dielectric layer and second layer of titanium nitride forms a metal-insulator-metal capacitor situated between each silicon fin and the polysilicon layer. The present exemplary embodiments are advantageous in that the MIM capacitor has greater capacitance than a planar capacitor over the same planar area.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A method of forming a FinFET structure comprising:
    forming silicon fins on a semiconductor substrate, each silicon fin having two sides and a horizontal surface;
    depositing sequential layers of a first layer of titanium nitride, a dielectric layer and a second layer of titanium nitride on the sides and horizontal surface of the silicon fins;
    depositing a polysilicon layer over the second layer of titanium nitride on the silicon fins and over the semiconductor substrate;
    selectively etching the polysilicon layer and the sequential layers of first layer of titanium nitride, dielectric layer and second layer of titanium nitride from a first end and a second end of the silicon fins so that the first and second ends of the silicon fins protrude from the polysilicon layer, the polysilicon layer having a surface that faces each of the first and second ends of the silicon fins;
    forming a spacer over each of the two surfaces and a portion of the first and second ends of the silicon fins such that the first and second ends of the silicon fins protrude from the spacers;
    forming epitaxial silicon over the first and second ends of the silicon fins to form sources and drains,
    wherein the combination of the first layer of titanium nitride, dielectric layer and second layer of titanium nitride forms a metal-insulator-metal capacitor situated between each silicon fin and the polysilicon layer.

2. The method of claim 1 wherein the dielectric layer comprises a material that is a high dielectric constant material.

3. The method of claim 1 further comprising forming epitaxial silicon between the silicon fins and in contact with the epitaxial silicon over the first and second ends of the silicon fins to form merged sources and drains that connect adjacent sources and drains, respectively.

4. The method of claim 1 further comprising doping the silicon fins and polysilicon layer.

5. The method of claim 4 wherein the doped fins and doped polysilicon are highly doped to a dopant level of $5 \times 10^{20}$ to $1 \times 10^{21}$ atoms/cm$^3$.

6. The method of claim 1 wherein the first and second layers of titanium nitride have a thickness of 5 to 10 nanometers (nm.) and the dielectric layer has a thickness of 2 to 5 nm.

7. A method of forming a FinFET structure having a metal-insulator-metal capacitor comprising:
    forming silicon fins on a semiconductor substrate, each silicon fin having two sides and a horizontal surface;
    forming a metal-insulator-metal capacitor on the sides and horizontal surface of the silicon fins by depositing sequential layers of a first layer of titanium nitride, a dielectric layer and a second layer of titanium nitride;
    depositing a polysilicon layer over the metal-insulator-metal capacitor and over the semiconductor substrate;
    selectively etching the polysilicon layer and the metal-insulator-metal capacitor from a first end and a second end of the silicon fins so that the first and second ends of the silicon fins protrude from the polysilicon layer, the polysilicon layer having a surface that faces each of the first and second ends of the silicon fins;
    forming a spacer over each of the two surfaces and a portion of the first and second ends of the silicon fins such that the first and second ends of the silicon fins protrude from the spacers; and
    forming epitaxial silicon over the first and second ends of the silicon fins to form sources and drains.

8. The method of claim 7 wherein the dielectric layer comprises a material that is a high dielectric constant material.

9. The method of claim 7 further comprising forming epitaxial silicon between the silicon fins and in contact with the epitaxial silicon over the first and second ends of the silicon fins to form merged sources and drains that connect adjacent sources and drains, respectively.

10. The method of claim 7 further comprising doping the silicon fins and polysilicon layer.

11. The method of claim 10 wherein the doped fins and doped polysilicon are highly doped to a dopant level of $5 \times 10^{20}$ to $1 \times 10^{21}$ atoms/cm$^3$.

12. The method of claim 7 wherein the first and second layers of titanium nitride have a thickness of 5 to 10 nanometers (nm.) and the dielectric layer has a thickness of 2 to 5 nm.

* * * * *